(12) United States Patent
Lee et al.

(10) Patent No.: US 12,310,058 B2
(45) Date of Patent: May 20, 2025

(54) THIN FILM TRANSISTOR SUBSTRATE

(71) Applicant: SAMSUNG DISPLAY CO., LTD., Yongin-si (KR)

(72) Inventors: Iljeong Lee, Yongin-si (KR); Youngwoo Park, Yongin-si (KR); Wangwoo Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 718 days.

(21) Appl. No.: 17/564,456

(22) Filed: Dec. 29, 2021

(65) Prior Publication Data

US 2022/0123122 A1 Apr. 21, 2022

Related U.S. Application Data

(63) Continuation of application No. 15/353,925, filed on Nov. 17, 2016, now abandoned.

(30) Foreign Application Priority Data

Apr. 12, 2016 (KR) .......................... 10-2016-0044926

(51) Int. Cl.
*H01L 27/12* (2006.01)
*H01L 29/40* (2006.01)
(Continued)

(52) U.S. Cl.
CPC ....... *H10D 30/673* (2025.01); *H10D 30/6755* (2025.01); *H10D 30/6757* (2025.01);
(Continued)

(58) Field of Classification Search
CPC ......... H01L 21/02365; H01L 21/76895; H01L 21/02205; H01L 21/77; H01L 27/1225;
(Continued)

(56) References Cited

U.S. PATENT DOCUMENTS 7,787,065 B2  8/2010  Lee et al.
8,203,264 B2  6/2012  Kang et al.
(Continued)

FOREIGN PATENT DOCUMENTS

CN  101996874  3/2011
CN  104201186  12/2014
(Continued)

*Primary Examiner* — Nikolay K Yushin
(74) *Attorney, Agent, or Firm* — F. CHAU & ASSOCIATES, LLC

(57) ABSTRACT

A thin film transistor substrate includes a substrate and a semiconductor layer disposed on the substrate. The semiconductor layer includes a channel region, a source region and a drain region. The thin film transistor further includes a gate electrode disposed on the semiconductor layer and that includes a lower surface and an upper surface. The thin film transistor includes a gate insulating layer disposed between the gate electrode and the semiconductor layer, and a first insulating layer disposed on the substrate. The first insulating layer exposes the upper surface of the gate electrode and surrounds the gate electrode. The gate electrode may have a shape in which the width of an upper surface thereof is greater than the width of a lower surface thereof.

19 Claims, 15 Drawing Sheets

(51) Int. Cl.
*H10D 30/67* (2025.01)
*H10D 64/01* (2025.01)
*H10D 86/01* (2025.01)
*H10D 86/40* (2025.01)
*H10D 86/60* (2025.01)
*H10D 99/00* (2025.01)
*H10K 59/121* (2023.01)

(52) U.S. Cl.
CPC .......... *H10D 64/01* (2025.01); *H10D 86/021* (2025.01); *H10D 86/423* (2025.01); *H10D 86/451* (2025.01); *H10D 86/481* (2025.01); *H10D 86/60* (2025.01); *H10D 99/00* (2025.01); *H10K 59/1213* (2023.02)

(58) Field of Classification Search
CPC . H01L 27/12; H01L 27/1248; H01L 27/1255; H01L 27/1259; H01L 29/40; H01L 29/66969; H01L 29/42384; H01L 29/423; H01L 29/401; H01L 29/7869; H01L 29/786; H01L 29/78696; H01L 29/78612; H01L 29/78621; H01L 29/0684; H01L 29/06; H01L 29/6675; H01L 29/66; H01L 29/0653; H01L 29/785; H01L 29/66742; H01L 29/78606; H01L 29/78642; H01L 29/78645; H01L 29/78618; H10K 59/1213; H10K 59/121; H10K 59/124; H10K 59/122; H10K 59/131; G02F 1/1368; G02F 1/136227; G02F 1/167; G02F 1/1676; H10D 30/673; H10D 30/67; H10D 30/6755; H10D 30/6757; H10D 30/6715; H10D 30/00; H10D 30/031; H10D 30/01; H10D 30/6706; H10D 64/01; H10D 86/021; H10D 86/01; H10D 86/423; H10D 86/40; H10D 86/451; H10D 86/481; H10D 86/60; H10D 99/00; H10D 10/821; H10D 10/80; H10D 84/953; H10D 84/90; H10D 84/619; H10D 84/60; H10D 84/0109; H10D 84/01; H10D 12/00; H10F 55/20; H10F 30/222; A23B 11/86; A23B 2/73; H02K 15/027

See application file for complete search history.

(56) References Cited

U.S. PATENT DOCUMENTS

| | | |
|---|---|---|
| 8,378,404 B2 | 2/2013 | Chen |
| 8,513,669 B2 | 8/2013 | Park et al. |
| 8,896,068 B2 | 11/2014 | Mayuzumi |
| 10,134,782 B2 | 11/2018 | Jin et al. |
| 2007/0126067 A1 | 6/2007 | Hattendorf et al. |
| 2009/0057788 A1 | 3/2009 | Hattendorf et al. |
| 2010/0148155 A1 | 6/2010 | Choi et al. |
| 2010/0244036 A1 | 9/2010 | Park et al. |
| 2013/0187161 A1 | 7/2013 | Yamazaki |
| 2013/0221347 A1 | 8/2013 | Isobe et al. |
| 2013/0285125 A1 | 10/2013 | Chen et al. |
| 2015/0118836 A1 | 4/2015 | Lin et al. |
| 2015/0129844 A1 | 5/2015 | Kang et al. |
| 2017/0294520 A1 | 10/2017 | Lee et al. |

FOREIGN PATENT DOCUMENTS

| | | |
|---|---|---|
| CN | 105428366 | 3/2016 |
| JP | 2008-158516 | 7/2008 |
| JP | 2011044517 | 3/2011 |
| KR | 10-2001-0076730 | 8/2001 |
| KR | 10-2009-0020028 | 2/2009 |
| KR | 10-2010-0108070 | 10/2010 |

THIN FILM TRANSISTOR SUBSTRATE

CROSS-REFERENCE TO RELATED APPLICATIONS

This application is a continuation of U.S. patent application Ser. No. 15/353,925 filed on Nov. 17, 2016, which claims priority under 35 U.S.C. § 119 to Korean Patent Application No. 10-2016-0044926, filed on Apr. 12, 2016 in the Korean Intellectual Property Office, the disclosures of which are incorporated by reference herein in their entireties.

TECHNICAL FIELD

The present invention relates to a thin film transistor substrate, a display device including the same, and a method of manufacturing the same.

DISCUSSION OF RELATED ART

The usage of display devices has diversified as they are being increasingly provided with a light weight and slim profile. As the display devices are made lighter and slimmer, a high resolution and large size screens are desired. To achieve this, thin film transistors are being miniaturized. However, as the thin film transistors shrink, their characteristics may deteriorate.

SUMMARY

An exemplary embodiment of the present invention provides a thin film transistor substrate. The thin film transistor substrate includes a substrate; a semiconductor layer disposed on the substrate, the semiconductor layer including a channel region, and a source region and a drain region at first and second sides of the channel region; a gate electrode disposed on the semiconductor layer; a gate insulating layer disposed between the gate electrode and the semiconductor layer; and a first insulating layer disposed on the substrate. The first insulating layer exposes an upper surface of the gate electrode and surrounds the gate electrode.

According to an exemplary embodiment of the present invention, the thin film transistor substrate may further include a first hole. The first hole may be in the first insulating layer. The gate electrode may be disposed within the first hole.

According to an exemplary embodiment of the present invention, the upper surface of the gate electrode and an upper surface of the first insulating layer may meet at the same plane.

According to an exemplary embodiment of the present invention, the thin film transistor substrate may further include a second insulating layer. The second insulating layer may be disposed on the upper surface of the gate electrode and an upper surface of the first insulating layer.

According to an exemplary embodiment of the present invention, the thin film transistor substrate may further include an auxiliary electrode. The auxiliary electrode may be disposed on the second insulating layer. The auxiliary electrode may contact the gate electrode via a contact hole in the second insulating layer.

According to an exemplary embodiment of the present invention, the thin film transistor substrate may further include an electrode. The electrode may be disposed on the second insulating layer. The electrode may be electrically connected to at least one of the source region and the drain region.

According to an exemplary embodiment of the present invention, the electrode may include a first electrode layer. The first electrode layer may contact at least one of the source region or the drain region. The electrode may further include a second electrode layer. The second electrode layer may be disposed on the first electrode layer. The second electrode layer may contact the first electrode layer.

According to an exemplary embodiment of the present invention, the first electrode layer may include a same material as the gate electrode.

According to an exemplary embodiment of the present invention, the thin film transistor substrate may further include a second hole. The second hole may be disposed in the first insulating layer. The second hole may expose at least one of the source region and the drain region. The first electrode layer may be disposed within the second hole.

According to an exemplary embodiment of the present invention, the first insulating layer may surround the first electrode layer. The first insulating layer may expose an upper surface of the first electrode layer.

According to an exemplary embodiment of the present invention, the second electrode layer may be disposed on the second insulating layer. The second electrode layer may contact the first electrode layer via a hole in the second insulating layer.

According to an exemplary embodiment of the present invention, the upper surface of the gate electrode may have a width greater than a width of a lower surface of the gate electrode.

According to an exemplary embodiment of the present invention, the semiconductor layer may have a length greater than a length of the gate insulating layer in a direction as that of the length of the semiconductor layer.

Exemplary embodiments of the present invention provide a display device. The display device includes a thin film transistor substrate according to exemplary embodiments of the present invention and a display element disposed on the thin film transistor substrate.

According to an exemplary embodiment of the present invention, the display element may include an organic light-emitting diode.

According to an exemplary embodiment of the present invention, the display element may include a liquid crystal capacitor.

An exemplary embodiment of the present invention provides a method of manufacturing a thin film transistor substrate. The method of manufacturing a thin film transistor substrate includes forming a semiconductor layer on a substrate, the semiconductor layer including a channel region, and a source region and a drain region at first and second sides of the channel region; forming a gate insulating layer on the semiconductor layer; forming a first preliminary insulating layer on the gate insulating layer; forming a first hole in the first preliminary insulating layer; forming a metallic layer on the first preliminary insulating layer, the metallic layer including a first portion filling the first hole; and removing the first preliminary insulating layer and the metallic layer, in which a portion of the first preliminary insulating layer and at least a portion of the first portion of the metallic layer remains. The remaining portion of the first preliminary insulating layer is a first insulating layer covering the semiconductor layer and the gate insulating layer. The remaining portion of the first portion of the metallic layer is a gate electrode.

According to an exemplary embodiment of the present invention, the first insulating layer may surround the gate electrode. The first insulating layer may expose an upper surface of the gate electrode.

According to an exemplary embodiment of the present invention, the gate insulating layer may be exposed via the first hole.

According to an exemplary embodiment of the present invention, the removing of the first preliminary insulating layer and the metallic layer may be performed using chemical mechanical polishing.

According to an exemplary embodiment of the present invention, the forming of the first hole may be performed using dry etching.

According to an exemplary embodiment of the present invention, an upper surface of the gate electrode and an upper surface of the first insulating layer may meet at the same plane.

According to an exemplary embodiment of the present invention, the forming of the first hole may be performed using dry etching.

According to an exemplary embodiment of the present invention, the method may further include forming a second insulating layer. The second insulating layer may cover the gate electrode and the first insulating layer.

According to an exemplary embodiment of the present invention, the method may further include forming an auxiliary electrode on the second insulating layer. The auxiliary electrode may contact the gate electrode via a hole in the second insulating layer.

According to an exemplary embodiment of the present invention, the method may further include forming a second hole in the first preliminary insulating layer. The forming of the second hole and the forming of the first hole may be performed by a same process.

According to an exemplary embodiment of the present invention, the second hole may expose at least one of the source region and the drain region. A second portion of the metallic layer may fill the second hole. The removing of the first preliminary insulating layer and the metallic layer may leave at least a portion of the second portion of the metallic layer.

According to an exemplary embodiment of the present invention, the first insulating layer may surround at least a portion of the first portion. The first insulating layer may also expose an upper surface of at least a portion of the first portion of the metallic layer.

According to an exemplary embodiment of the present invention, the method may further include forming an electrode layer on the second insulating layer. The electrode layer may contact at least a portion of the second portion of the metallic layer via a hole in the second insulating layer.

According to an exemplary embodiment of the present invention, the forming of the semiconductor layer and the forming of the gate insulating layer may be performed by a same mask process.

According to an exemplary embodiment of the present invention, the method may further include performing wet washing on the first preliminary insulating layer in which the first hole. The first hole may be disposed in the first preliminary insulating layer.

BRIEF DESCRIPTION OF THE DRAWINGS

These and/or other features of the present invention will become more apparent by describing in detail exemplary embodiments thereof with reference to the accompanying drawings, in which.

DETAILED DESCRIPTION OF THE EMBODIMENTS

Figure 1:
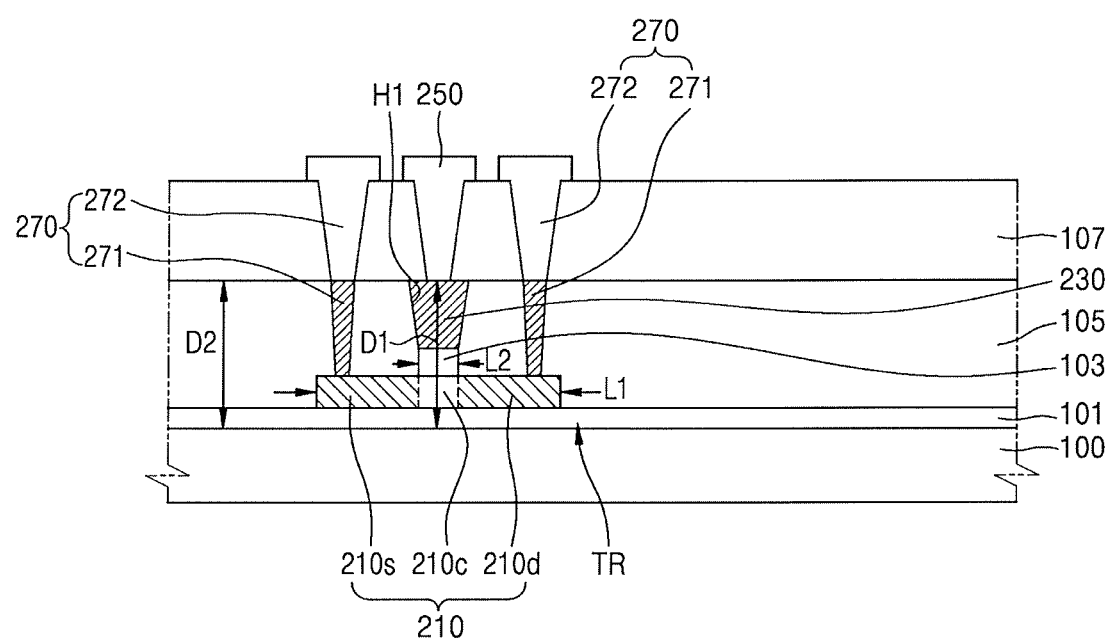
FIG. 1 is a cross-sectional view illustrating a thin film transistor substrate according to an exemplary embodiment of the present invention.

Exemplary embodiments of the present invention will now be described in reference to the drawings. The present invention may, however, be embodied in many different forms and should not be construed as limited to the embodiments set forth herein. In the drawings, like references numerals may refer to like elements throughout.

As used herein, the singular forms "a" "an" and "the" are intended to include the plural forms as well, unless the context clearly indicates otherwise.

Sizes of elements in the drawings may be exaggerated for convenience of explanation.

It is to be understood that a specific process order may be performed differently from the described order. For example, two consecutively described processes may be performed substantially at the same time or performed in an order opposite to the described order.

It will be understood that when a layer, region, or component is referred to as being "connected" to another layer, region, or component, it may be "directly connected" to the other layer, region, or component or may be "indirectly connected" to the other layer, region, or component with other layer, region, or component interposed therebetween.

FIG. 1 is a cross-sectional view illustrating a thin film transistor (TFT) substrate according to an exemplary embodiment of the present invention.

Referring to FIG. 1, the TFT substrate may include a substrate 100. The TFT substrate may further include a thin film transistor (TFT) TR disposed above the substrate 100. The TFT TR may be a top gate-type TFT in which a gate electrode 230 is disposed above a semiconductor layer 210. A buffer layer 101 may be disposed between the semiconductor layer 210 and the substrate 100. The buffer layer 101 may include SiOx and/or SiNx. The buffer layer 101 may increase the prevention of impurities from penetrating into the semiconductor layer 210.

The semiconductor layer 210 may include, for example, amorphous silicon (a-Si) or polycrystalline silicon (poly-Si). According to an exemplary embodiment of the present invention, the semiconductor layer 210 may include an oxide of at least one of indium (In), gallium (Ga), tin (Sn), zirconium (Zr), vanadium (V), hafnium (Hf), cadmium (Cd), germanium (Ge), chromium (Cr), titanium (Ti), and zinc (Zn). The semiconductor layer 210 may include a channel region 210c. The semiconductor layer 210 may further include a source region 210s and a drain region 210d. The source region 210s and the drain region 210d may be disposed on either side of the channel region 210c, respectively.

A gate insulating layer 103 may be disposed over the channel region 210c of the semiconductor layer 210. The gate insulating layer 103 may include an inorganic material such as SiOx, SiNx, SiON, aluminum oxide ($Al_2O_3$), CuOx, tetraterbium heptaoxide ($Tb_4O_7$), yttrium(III) oxide ($Y_2O_3$), niobium(V) oxide ($Nb_2O_5$), and praseodymium(III) oxide ($Pr_2O_3$). A length L2 of the gate insulating layer 103 in a first direction from the source region 210s to the drain region 210d of the semiconductor layer 210 may be less than a length L1 of the semiconductor layer 210. Accordingly, the length L2 of the gate insulating layer 103 in the first direction from the source region 210s to the drain region 210d of the semiconductor layer 210 may be substantially the same as a length of the channel region 210c in the same direction.

A gate electrode 230 may be disposed above and overlap the channel region 210c of the semiconductor layer 210. The gate insulating layer 103 may be disposed between the gate electrode 230 and the channel region 210c. The gate electrode 230 may be disposed in a first hole H1. The first hole H1 may be inside a first insulating layer 105. The first insulating layer may be disposed on the substrate 100 and the buffer layer 101. According to an exemplary embodiment of the present invention, the gate electrode 230 may have a reverse tapered shape in which the width of an upper surface thereof is greater than the width of a lower surface thereof.

The gate electrode 230 may include at least one of copper (Cu), magnesium (Mg), aluminum (Al), platinum (Pt), palladium (Pd), gold (Au), nickel (Ni), neodymium (Nd), iridium (Ir), chromium (Cr), lithium (Li), calcium (Ca), molybdenum (Mo), titanium (Ti), tungsten (W), and silver (Ag).

The first insulating layer 105 may surround the gate electrode 230. The first insulating layer 105 may also expose an upper surface of the gate electrode 230. The first insulating layer 105 may include an inorganic insulating material including SiOx, SiNx, aluminum oxide ($Al_2O_3$), CuOx, tetraterbium heptaoxide ($Tb_4O_7$), yttrium(III) oxide ($Y_2O_3$), niobium(V) oxide ($Nb_2O_5$), and praseodymium(III) oxide ($Pr_2O_3$). Alternatively, the first insulating layer 105 may include at least one organic insulating material including one of polyimide (PI), polyamide (PA), an acrylic resin, benzocyclobutene (BCB), and a phenol resin. Alternatively, the first insulating layer 105 may include a multi-layered structure. The multi-layered structure may include an organic insulating material and an inorganic insulating material. The organic insulating material and the inorganic insulating material may be alternatively stacked.

An upper surface of the first insulating layer 105 and an upper surface of the gate electrode 230 may be arranged above substantially the same plane in a vertical cross-section by a manufacturing process described herein. The first insulating layer 105 and the gate electrode 230 may be manufactured by chemical mechanical polishing (CMP), therefore, the upper surface of the first insulating layer 105 and the upper surface of the gate electrode 230 may be arranged above substantially the same plane. The upper surface of the first insulating layer 105 may have substantially uniform roughness. The upper surface of the gate electrode 230 may have substantially uniform roughness.

A first distance D1 which may be referred to as a first distance from the substrate 100 to the upper surface of the gate electrode 230 may be substantially the same as a second distance D2 which may be referred to as a second distance from the substrate 100 to the upper surface of the first insulating layer 105. Accordingly, the first distance D1 may be substantially the same as the second distance D2. A difference between the first distance D1 and the second distance D2 may be less than about 100 Å.

The gate electrode 230 may be connected to an auxiliary electrode 250. The auxiliary electrode 250 may be disposed above a second insulating layer 107. The auxiliary electrode 250 may contact the upper surface of the gate electrode 230 via a hole passing through the second insulating layer 107.

The auxiliary electrode 250 may include at least one of copper (Cu), magnesium (Mg), aluminum (Al), platinum (Pt), palladium (Pd), gold (Au), nickel (Ni), neodymium (Nd), iridium (Ir), chromium (Cr), lithium (Li), calcium (Ca), molybdenum (Mo), titanium (Ti), tungsten (W), and silver (Ag).

At least one of the source region 210s and the drain region 210d of the semiconductor layer 210 may be connected to an electrode 270. The electrode 270 may include a plurality of electrode layers. For example, the electrode 270 may include a first electrode layer 271 and a second electrode layer 272.

The first electrode layer 271 may include substantially the same material as the gate electrode 230. An upper surface of the first electrode layer 271 may be disposed above substantially the same plane as the upper surface of the gate electrode 230 and the upper surface of the first insulating layer 105. The upper surface of the first electrode layer 271, the upper surface of the first insulating layer 105, and the upper surface of the gate electrode 230 may be arranged above substantially the same plane by a manufacturing process described herein. Since the first electrode layer 271, the first insulating layer 105, and the gate electrode 230 may be manufactured by chemical mechanical polishing (CMP), the upper surface of the first electrode layer 271, the upper surface of the first insulating layer 105, and the upper surface of the gate electrode 230 may be arranged above substantially the same plane. Accordingly, the upper surface of the first electrode layer 271, the upper surface of the first insulating layer 105, and the upper surface of the gate electrode 230 may have substantially uniform roughness.

A distance from the substrate 100 to the upper surface of the first electrode layer 271 may be substantially the same as the first distance D1 from the substrate 100 to the upper surface of the gate electrode 230. Accordingly, the distance from the substrate 100 to the upper surface of the first electrode layer 271 may be substantially the same as the first distance D1 from the substrate 100 to the upper surface of the gate electrode 230. A difference between the distance and the first distance D1 may be less than about 100 Å.

The second electrode layer 272 may include substantially the same material as the auxiliary electrode 250. The second electrode layer 272 may be disposed above the second insulating layer 107. The second electrode layer 272 may contact the first electrode layer 271 via a hole passing through the second insulating layer 107.

According to an exemplary embodiment of the present invention, the gate electrode 230 may be manufactured to have a fine line width via dry etching and chemical mechanical polishing (CMP).

FIGS. 2A to 7 are cross-sectional views illustrating a method of manufacturing a thin film transistor (TFT) substrate according to an exemplary embodiment of the present invention.

Figure 2A:
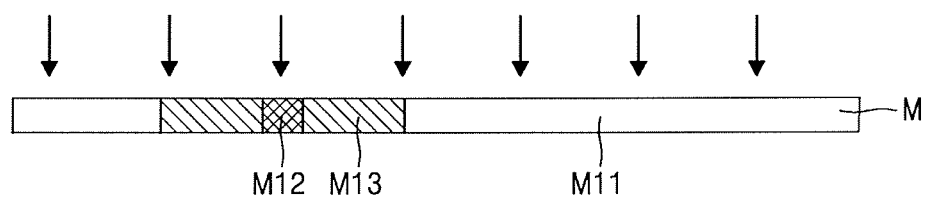
FIGS. 2A to 7 are cross-sectional views illustrating a method of manufacturing a thin film transistor substrate according to an exemplary embodiment of the present invention.
Figure 2A:
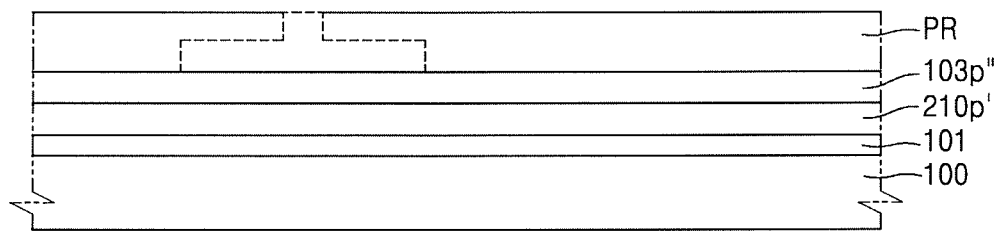
Figure 2B:
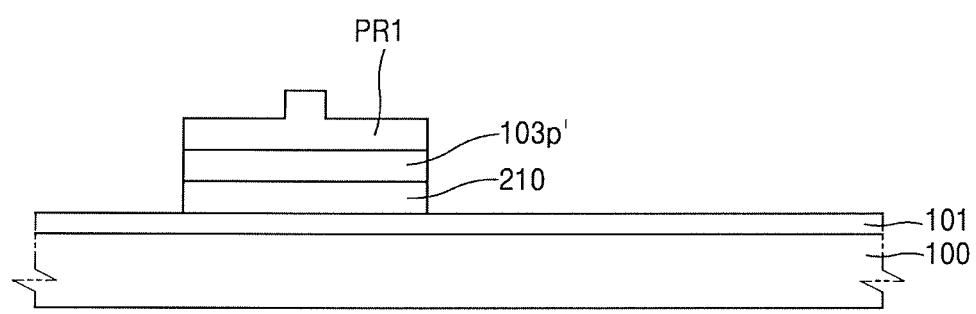
Figure 2C:
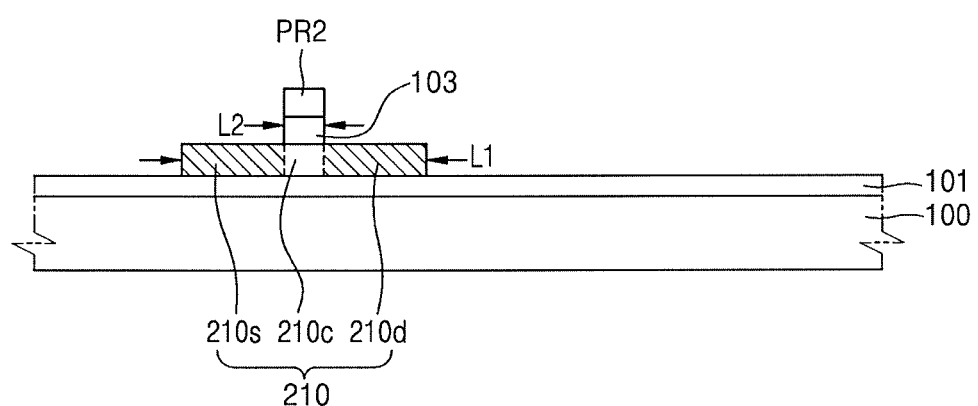

FIGS. 2A to 2C illustrate a first mask process according to an exemplary embodiment of the present invention.

Referring to FIG. 2A, a semiconductor material layer 210p' and an insulating material layer 103p'' may be sequentially formed above the substrate 100.

The substrate 100 may include various materials such as a plastic material including polyethylene terephthalate (PET), polyethylene naphthalate (PEN), and polyimide (PI); however, exemplary embodiments of the present invention are not limited thereto.

The buffer layer 101 may be formed above the substrate 100. This may be done before forming the semiconductor material layer 210p'. The buffer layer 101 may increase the prevention of impurities from passing through the substrate 100 and penetrating into the semiconductor material layer 210p'. The buffer layer 101 may include SiOx and/or SiNx. The buffer layer 101 may include a single layer or multiple layers.

The semiconductor material layer 210p' may include a silicon-based material such as amorphous silicon (a-Si) or polycrystalline silicon (poly-Si). Alternatively, the semiconductor material layer 210p' may include an oxide of at least one of indium (In), gallium (Ga), tin (Sn), zirconium (Zr), vanadium (V), hafnium (Hf), cadmium (Cd), germanium (Ge), chromium (Cr), titanium (Ti), and zinc (Zn).

The insulating material layer 103p'' may include an inorganic material such as SiOx, SiNx, SiON, aluminum oxide ($Al_2O_3$), CuOx, tetraterbium heptaoxide ($Tb_4O_7$), yttrium (III) oxide ($Y_2O_3$), niobium(V) oxide ($Nb_2O_5$), and praseodymium(III) oxide ($Pr_2O_3$). The insulating material layer 103p'' may be formed using various deposition methods such as plasma-enhanced chemical vapor deposition (PECVD), atmospheric pressure chemical vapor deposition (APCVD), and low pressure chemical vapor deposition (LPCVD); however, exemplary embodiments of the present invention are not limited thereto.

A photosensitive material such as a photoresist may be coated above the insulating material layer 103p''. A photoresist layer PR from which a solvent has been removed may be formed by pre-baking or soft baking. In order to pattern the photoresist layer PR, a half-tone mask M may be used. The half-tone mask M may have a predetermined pattern and may be aligned above the substrate 100. An exposure to irradiating light in a predetermined wavelength band may be performed on the photoresist layer PR.

The half-tone mask M may include a light-transmission portion M11, a light-blocking portion M12, and a semi-transmission portion M13. The light-transmission portion M11 may transmit light in a predetermined wavelength band, the light-blocking portion M12 may block irradiated light, and the semi-transmission portion M13 may transmit only a portion of irradiated light.

FIG. 2B illustrates a first photoresist pattern PR1 remaining after performing a developing process in which an exposed portion of the photoresist layer PR is removed.

Referring to FIGS. 2A and 2B, a patterned insulating material layer 103p' and the semiconductor layer 210 may be formed by patterning the insulating material layer 103p'' and the semiconductor layer 210p' using the first photoresist pattern PR1 as a mask.

Referring to FIGS. 2A to 2C, a portion of the first photoresist pattern PR1 corresponding to the semi-transmission portion M13 may be removed by ashing. A thickness of a portion of the first photoresist pattern PR1 corresponding to the light-blocking portion M12 may be reduced by ashing. Accordingly, a second photoresist pattern PR2 may be formed.

The gate insulating layer 103 may be formed by patterning the patterned insulating material layer 103p' using the second photoresist pattern PR2 as a mask. The length L2 of the gate insulating layer 103 may be less than the length L1 of the semiconductor layer 210.

The semiconductor layer 210 may be doped or plasma-processed using the second photoresist pattern PR2 as a mask. According to an exemplary embodiment of the present invention, when the semiconductor layer 210 includes a silicon-based material, the semiconductor layer 210 may be doped with impurities by using the second photoresist pattern PR2 as a mask. A non-doped region of the semiconductor layer 210 that is masked by the second photoresist pattern PR2 may become the channel region 210c. The doped regions may become the source region 210s and the drain region 210d, respectively. According to an exemplary embodiment of the present invention, when the semiconductor layer 210 includes an oxide, the semiconductor layer 210 may become a conductor by performing a plasma process using the second photoresist pattern PR2 as a mask. A non-processed region of the semiconductor layer 210 that is masked by the second photoresist pattern PR2 may become the channel region 210c. The conductive regions may become the source region 210s and the drain region 210d, respectively.

Afterwards, the second photoresist pattern PR2 may be removed.

Figure 3:
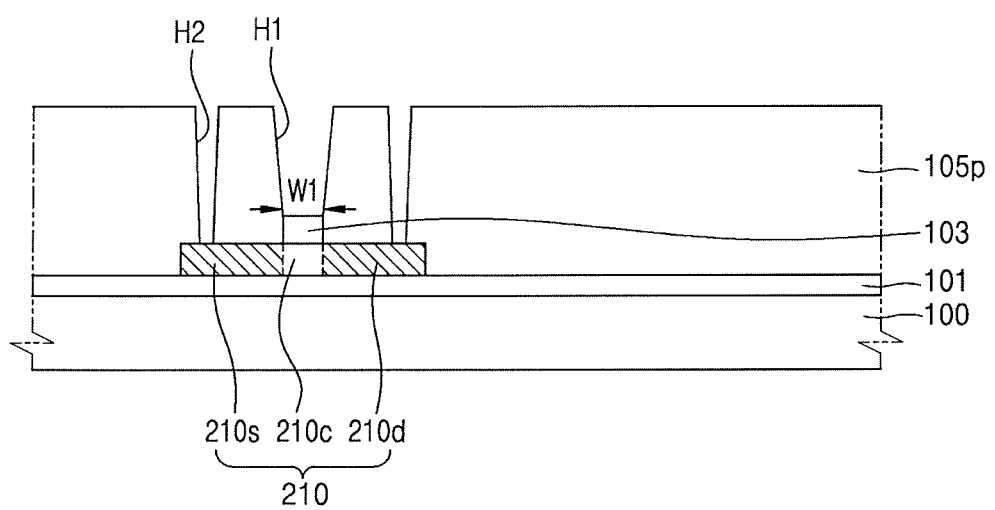

FIG. 3 illustrates a second mask process according to an exemplary embodiment of the present invention.

Referring to FIG. 3, a first preliminary insulating layer 105p may be formed above the semiconductor layer 210 and the gate insulating layer 103. A first hole H1 and second holes H2 may be formed by using a mask. According to an exemplary embodiment of the present invention, the first hole H1 and the second holes H2 may have a reverse tapered shape in which a width increases toward an upper portion thereof; however, exemplary embodiments of the present invention are not limited thereto.

The first preliminary insulating layer 105p may include an inorganic insulating material including SiOx, SiNx, aluminum oxide ($Al_2O_3$), CuOx, tetraterbium heptaoxide ($Tb_4O_7$), yttrium(III) oxide ($Y_2O_3$), niobium(V) oxide ($Nb_2O_5$), and praseodymium(III) oxide ($Pr_2O_3$). Alternatively, the first preliminary insulating layer 105p may include at least one organic insulating material including one of polyimide (PI), polyamide (PA), an acrylic resin, benzocyclobutene (BCB), and a phenol resin. Alternatively, the first preliminary insulating layer 105p may include a multi-layered structure including an organic insulating material and an inorganic insulating material. The organic insulating material and the inorganic insulating material may be alternatively stacked.

The first hole H1 may overlap the channel region 210c and expose the gate insulating layer 103. The second holes H2 may expose at least one of the source region 210s and the drain region 210d of the semiconductor layer 210.

The first hole H1 and the second holes H2 may be formed by dry etching. Isotropic or anisotropic dry etching may be used. The gate electrode 230 may be disposed within the first hole H1. The line width of the gate electrode 230 may be determined by the width W1 of the first hole H1. For example, the width W1 of the first hole H1 may be the line width of the gate electrode 230. If the first hole H1 is formed by wet etching, an undercut may occur. Furthermore, fine etching may be difficult to perform and manufacturing a TFT TR suitable for a high resolution display device may become unobtainable. However, in the etching process according to an exemplary embodiment of the present invention, since the first hole H1 may be formed by dry etching, the width W1 of the first hole H1 or the fine line width of the gate electrode 230 to be formed within the first hole H1 may be adjusted.

A wet washing process may be performed on the first preliminary insulating layer 105p including the first hole H1 and the second holes H2. The wet washing process may use buffered oxide etchant (BOE).

Figure 4:
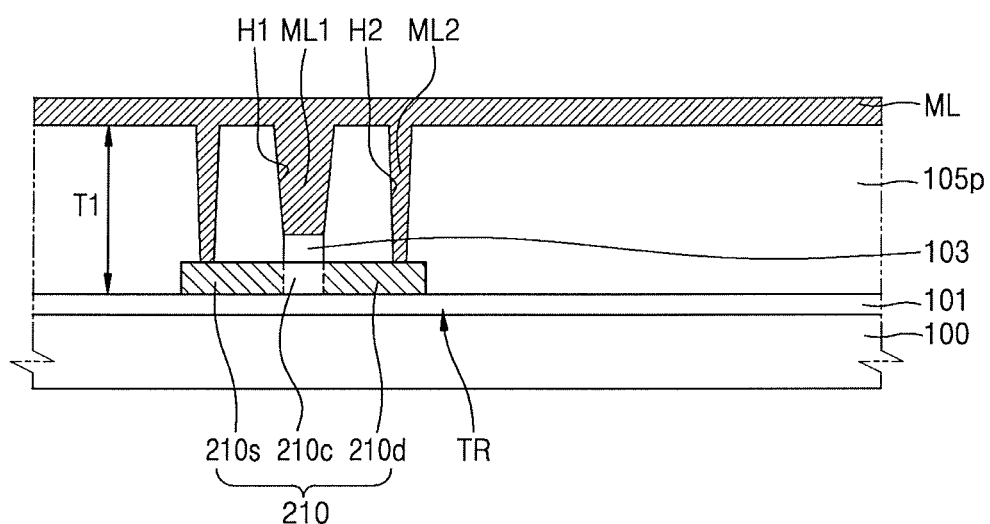
Figure 5:
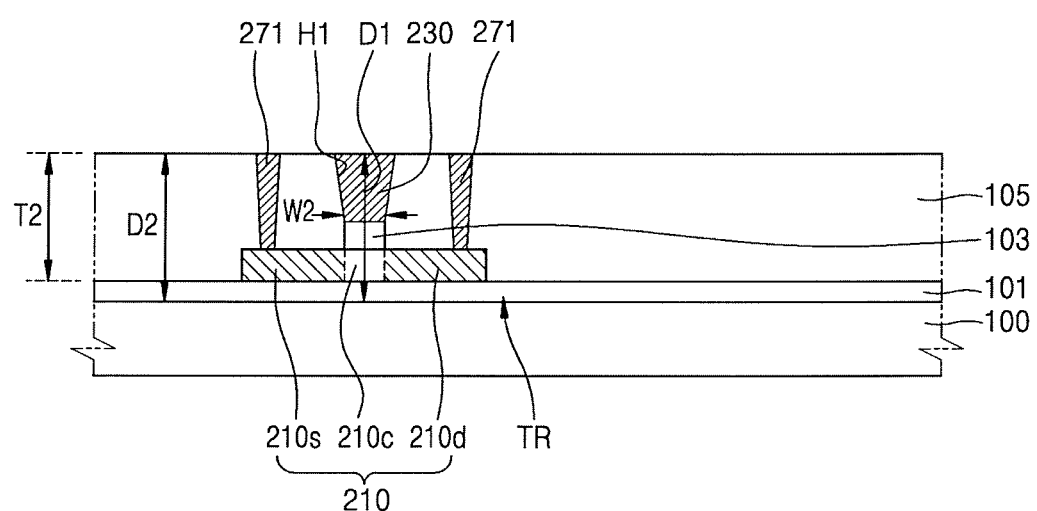

FIGS. 4 and 5 illustrate a process of forming the gate electrode 230 according to an exemplary embodiment of the present invention.

Referring to FIG. 4, a metallic layer ML may be formed above the first preliminary insulating layer 105p. The metallic layer ML may include at least one of copper (Cu), magnesium (Mg), aluminum (Al), platinum (Pt), palladium (Pd), gold (Au), nickel (Ni), neodymium (Nd), iridium (Ir), chromium (Cr), lithium (Li), calcium (Ca), molybdenum (Mo), titanium (Ti), tungsten (W), and silver (Ag). The metallic layer ML may be substantially entirely formed above the first preliminary insulating layer 105p. A first portion ML1 of the metallic layer ML may fill the first hole H1. A second portion ML2 of the metallic layer ML may fill the second holes H2.

Referring to FIG. 5, a portion of the first preliminary insulating layer 105p and a portion of the metallic layer ML may be removed. The portion of the first preliminary insulating layer 105p and the portion of the metallic layer ML may be substantially simultaneously removed by a polishing process, such as chemical mechanical polishing (CMP).

Through chemical mechanical polishing (CMP), at least a portion of the first portion ML1 of the metallic layer ML inside the first hole H1 may remain and may become the gate electrode 230. A remaining portion of the first preliminary insulating layer 105p may become the first insulating layer 105. At least a portion of the second portion ML2 of the metallic layer ML inside the second holes H2 may remain and may become the first electrode layers 271. The first insulating layer 105 may have a thickness T2 less than a thickness T1 of the first preliminary insulating layer 105p.

The upper surface of the gate electrode 230 and the upper surface of the first insulating layer 105 may be arranged above substantially the same plane by the chemical mechanical polishing (CMP) process. For example, the upper surface of the gate electrode 230 and the upper surface of the first insulating layer 105 may have substantially uniform roughness. The upper surface of the gate electrode 230 and the upper surface of the first insulating layer 105 may be located above the substantially the same plane. Furthermore, the first distance D1 from the substrate 100 to the upper surface of the gate electrode 230 may be substantially the same as the second distance D2 from the substrate 100 to the upper surface of the first insulating layer 105.

Since the gate electrode 230 may be disposed inside the first hole H1 in the first insulating layer 105 and may directly contact the lateral surface of the first insulating layer 105 surrounding the first hole H1, the line width W2 of the gate electrode 230 may be substantially the same as the width W1 of the first hole H1.

Since the first electrode layer 271 may be formed during substantially the same process as the gate electrode 230, the upper surface of the first electrode layer 271 may be arranged above substantially the same plane as the upper surface of the gate electrode 230 and the upper surface of first insulating layer 105. For example, the upper surface of the first electrode layer 271, the upper surface of the gate electrode 230, and the upper surface of the first insulating layer 105 may have substantially uniform roughness and may be arranged above substantially the same plane. Therefore, a distance from the substrate 100 to the first electrode layer 271 may be substantially the same as the first distance D1.

Figure 6:
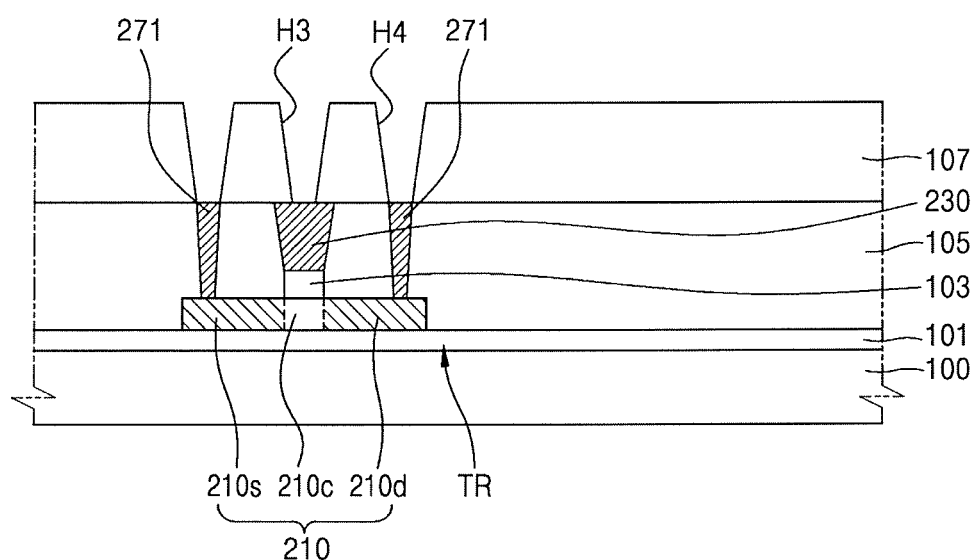

FIG. 6 illustrates a third mask process according to an exemplary embodiment of the present invention.

Referring to FIG. 6, the second insulating layer 107 covering the gate electrode 230, the first electrode layer 271, and the first insulating layer 105 may be formed, and a third hole H3 and fourth holes H4 may be formed by using a mask.

The second insulating layer 107 may include an inorganic insulating material including at least one of SiOx, SiNx, aluminum oxide ($Al_2O_3$), CuOx, tetraterbium heptaoxide ($Tb_4O_7$), yttrium(III) oxide ($Y_2O_3$), niobium(V) oxide ($Nb_2O_5$), and praseodymium(III) oxide ($Pr_2O_3$). Alternatively, the second insulating layer 107 may include at least one organic insulating material including one of polyimide (PI), polyamide (PA), an acrylic resin, benzocyclobutene (BCB), and a phenol resin. Alternatively, the second insulating layer 107 may include a multi-layered structure in which an organic insulating material and an inorganic insulating material may be alternatively stacked.

The third hole H3 may expose the gate electrode 230. The third hole H3 may be formed by dry etching. The fourth holes H4 may expose the first electrode layers 271. The fourth holes H4 may be formed by dry etching.

Figure 7:
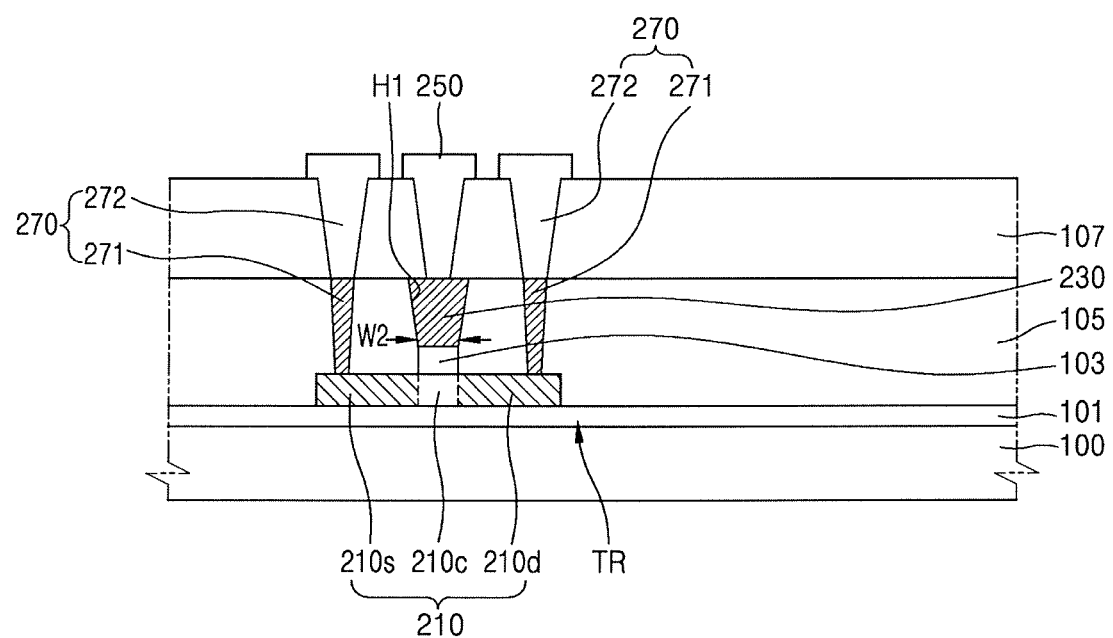

FIG. 7 illustrates a fourth mask process according to an exemplary embodiment of the present invention.

Referring to FIG. 7, the auxiliary electrode 250 and the second electrode layers 272 may be formed by forming and patterning a metallic layer above the second insulating layer 107.

The auxiliary electrode 250 may be electrically connected to the gate electrode 230 by contacting the upper surface of the gate electrode 230. The second electrode layer 272 may be electrically connected to the first electrode layer 271 by contacting the first electrode layer 271. The first electrode layer 271 and the second electrode layer 272 may configure the electrode 270 through contacting each other.

Figure 8:
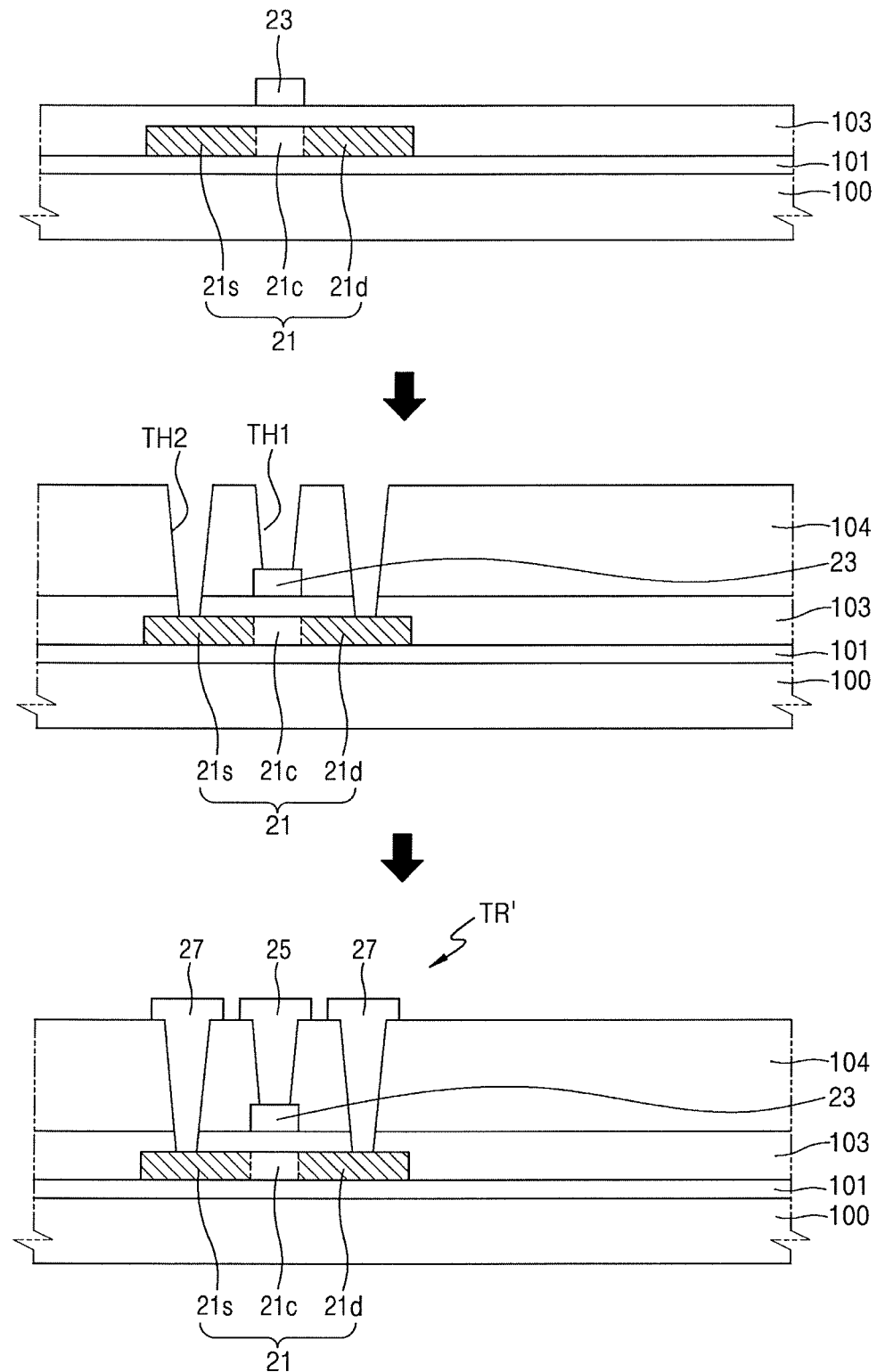
FIG. 8 is a cross-sectional view illustrating a manufacturing process according to a comparative example.

FIG. 8 is a cross-sectional view illustrating a manufacturing process according to a comparative example.

Referring to FIG. 8, after a gate electrode 23 is formed by forming a metallic layer above a semiconductor layer 21 and patterning the metallic layer via wet etching, a source region 21s and a drain region 21d are formed at both sides of a channel region 21c, which is a non-doped region, by doping the semiconductor layer 21 with impurities using the gate electrode 23 as a mask. An interlayer insulating layer 104 including a first through hole TH1 exposing the gate electrode 23 and second through holes TH2 respectively exposing the source region 21s and the drain region 21d is formed. An auxiliary electrode 25 and electrodes 27 are formed by forming and patterning a metallic layer above the interlayer insulating layer 104.

Prior to forming the metallic layer, the source region 21s and the drain region 21d of the semiconductor layer 21 exposed via the second through holes TH2 may be washed by buffered oxide etchant (BOE). The buffered oxide etchant (BOE) may include hydrogen fluoride (HF). The buffered oxide etchant (BOE) may damage metal. Therefore, the gate electrode 23 exposed via the first through hole TH1 may be damaged by the buffered oxide etchant (BOE). For example, a chemically resistant characteristic of the gate electrode 23 including aluminum (Al) or copper (Cu) deteriorates against the buffered oxide etchant (BOE), so that the driving characteristic of a TFT TR' may deteriorate. Although titanium nitride (TiN) and other compounds may be included the gate electrode 23, the characteristic of the TFT TR' may deteriorate due to particles generated during a sputtering process of forming the titanium nitride (TiN).

However, according to an exemplary embodiment of the present invention as described with reference to FIGS. 2A to 7, since a wet washing process may be performed prior to the formation of the gate electrode 230, it may prevent the gate electrode 230 from being damaged by the buffered oxide etchant (BOE). Additionally, the TFT TR may be formed irrespective of the metal type forming the gate electrode 230.

As illustrated in FIG. 8, when the gate electrode 23 is formed by forming and patterning the metallic layer, the patterning process may be performed by wet etching. Since the gate electrode 23 is formed by wet etching, an undercut may occur and it may be difficult to finely adjust a line width.

However, according to an exemplary embodiment of the present invention as described with reference to FIGS. 2A to 7, by forming the first hole H1 in the first preliminary insulating layer 105p via dry etching, metal may fill the first hole H1. The gate electrode 230 may also be formed by chemical mechanical polishing (CMP). Therefore, it may be possible to finely adjust the line width of the gate electrode 230 irrespective of a metal type forming the gate electrode 230.

Figure 9:
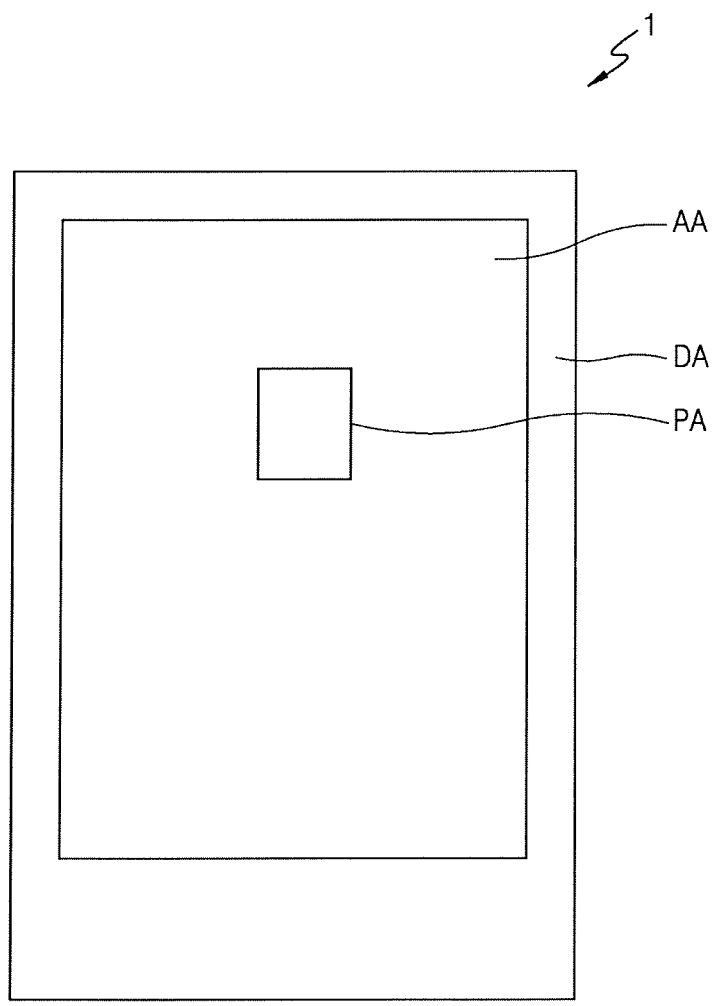
FIG. 9 is a plan view illustrating a display device including a thin film transistor substrate according to an exemplary embodiment of the present invention.

FIG. 9 is a plan view of a display device 1 including a thin film transistor (TFT) substrate according to an exemplary embodiment of the present invention.

Referring to FIG. 9, the display device 1 may include an active area AA and a dead area DA. The dead area DA may surround the active area AA. The active area AA may include pixel areas PA. A pixel may be provided to substantially each pixel area PA. According to an exemplary embodiment of the present invention, the display device 1 may be an organic light-emitting display device; however, exemplary embodiments of the present invention are not limited thereto. Substantially each pixel area PA may include a pixel circuit and an organic light-emitting diode (OLED). The organic light-emitting diode (OLED) may be connected to the pixel circuit.

Figure 10:
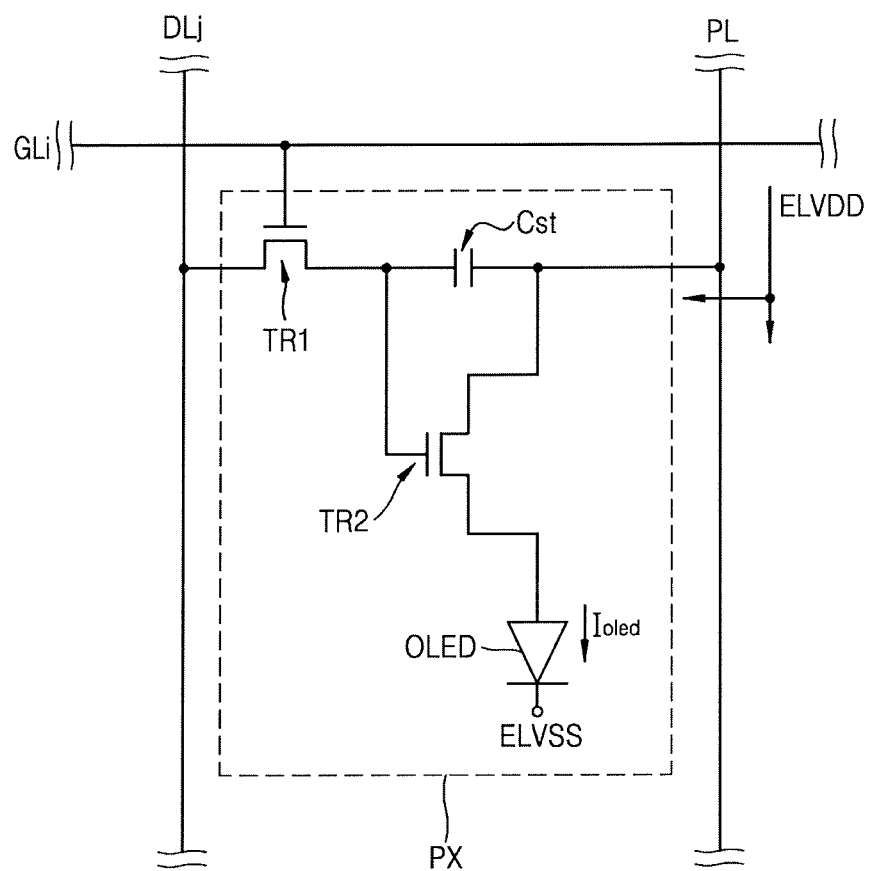
FIG. 10 is an equivalent circuit diagram illustrating a pixel of one pixel region according to an exemplary embodiment of the present invention.
Figure 11:
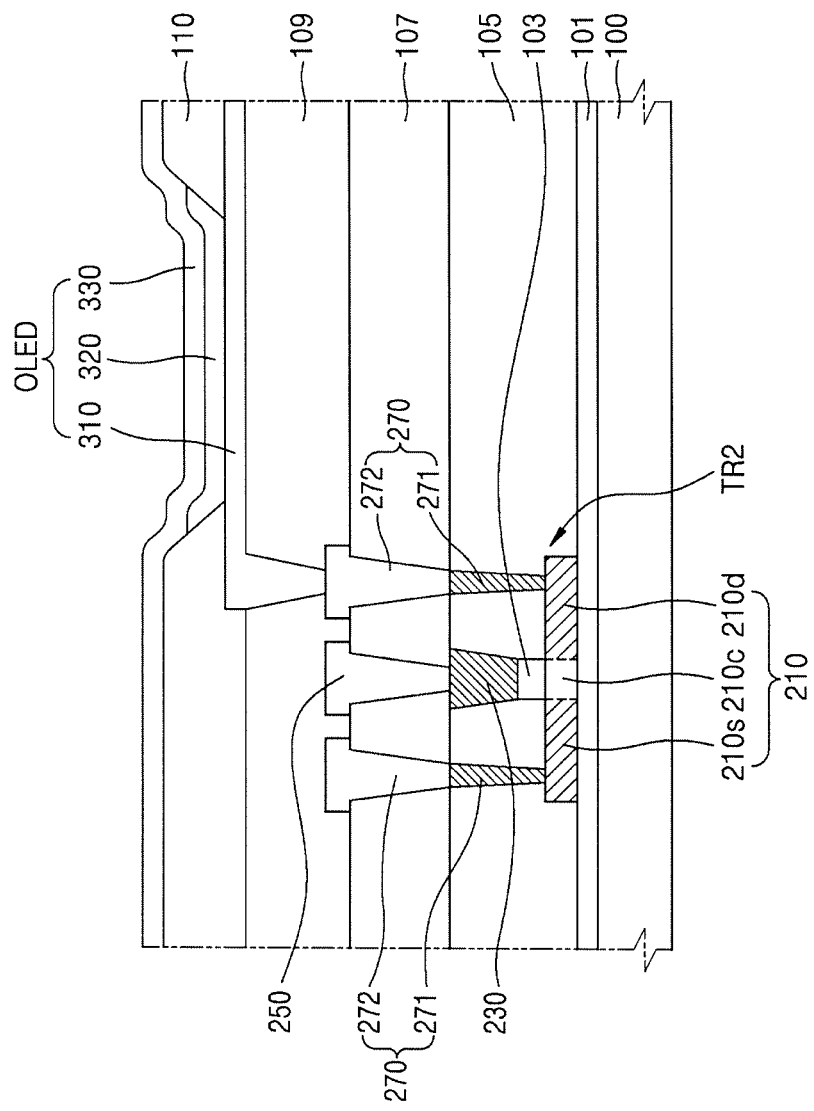
FIG. 11 is a cross-sectional view illustrating a pixel according to an exemplary embodiment of the present invention.

FIG. 10 is an equivalent circuit diagram of a pixel of a pixel region according to an exemplary embodiment of the present invention. FIG. 11 is a cross-sectional view of a pixel according to an exemplary embodiment of the present invention.

Referring to FIG. 10, substantially each pixel PX may include a first thin film transistor (TFT) TR1, a second thin film transistor (TFT) TR2, a storage capacitor Cst, and an organic light emitting diode OLED. The organic light-emitting diode OLED may emit light of predetermined brightness by using a driving current $I_{oled}$.

The first TFT TR1 may output a data signal applied to a j-th data line DLj in response to a gate signal applied to an i-th gate line GLi. The second TFT TR2 may control a driving current flowing through the organic light-emitting diode OLED in response to the amount of charge stored in the storage capacitor Cst. A pixel PX may receive a first voltage ELVDD and a second voltage ELVSS. The first voltage ELVDD and the second voltage ELVSS may have different voltage levels, respectively. An electrode of the storage capacitor Cst may be connected to a power line PL.

Referring to FIG. 11, the second TFT TR2 may be substantially the same as the TFT TR as described with reference to FIGS. 1 to 7.

According to an exemplary embodiment of the present invention, the auxiliary electrode 250 may be connected to the gate electrode 230 of the second TFT TR2. The auxiliary electrode 250 may serve as a bridge wiring and may connect the second TFT TR2 to another TFT (e.g. the first TFT TR1). Alternatively, the auxiliary electrode 250 may service as a bride wiring and may connect the second TFT TR2 to other electrical element, such as the storage capacitor Cst. The electrode 270 connected to the source region 210s of the second TFT TR2 may be connected to the power line PL. The electrode 270 connected to the drain region 210d may be connected to a pixel electrode 310 of the organic light-emitting diode OLED. The pixel electrode 310 may be connected to the second TFT TR2 via a hole formed in a planarization layer 109.

The pixel electrode 310 of the organic light-emitting diode OLED may receive a voltage corresponding to the first voltage ELVDD from the second TFT TR2. An opposite electrode 330 of the organic light-emitting diode OLED may receive the second voltage ELVSS. Accordingly, the organic light-emitting diode OLED may emit light. An emission layer 320 of the organic light-emitting diode OLED may be disposed between the pixel electrode 310 and the opposite electrode 330. The emission layer 320 may be exposed via a pixel-defining layer 110. The emission layer 320 may emit a predetermined light.

Although FIG. 11 illustrates the second TFT TR2 as substantially the same as the TFT TR as described with reference to FIGS. 1 to 7, exemplary embodiments of the present invention are not limited thereto. According to an exemplary embodiment of the present invention, the first TFT TR1 may have substantially the same structure as the TFT TR as described with reference to FIGS. 1 to 7. The TFT TR1 may also be formed by substantially the same process. Although the display device as described with reference to FIGS. 9 to 11 may be an organic light-emitting display device, exemplary embodiments of the present invention are not limited thereto. According to an exemplary embodiment of the present invention, the display device may be a liquid crystal display device.

Figure 12:
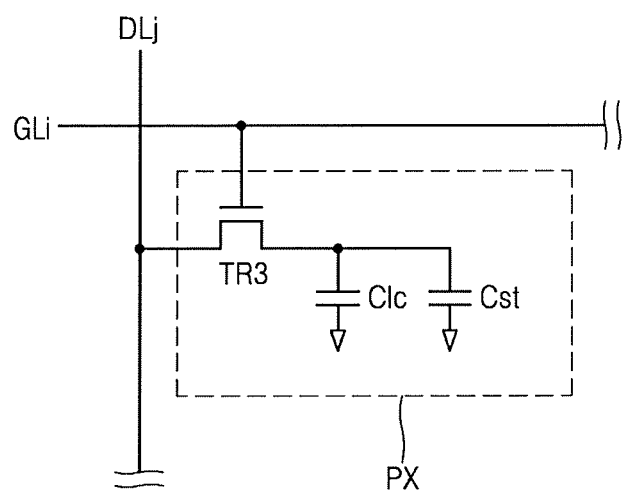
FIG. 12 is an equivalent circuit diagram illustrating a pixel of one pixel region according to an exemplary embodiment of the present invention.
Figure 13:
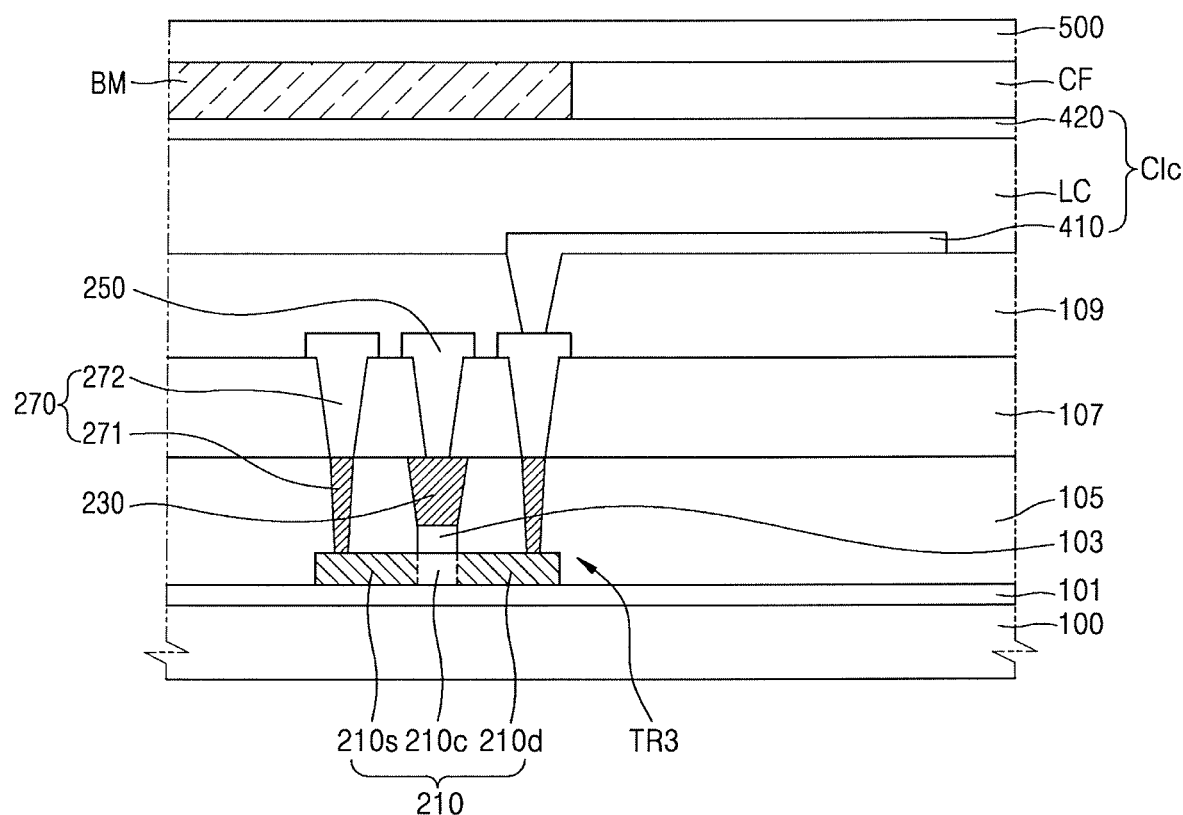
FIG. 13 is a cross-sectional view illustrating a pixel according to an exemplary embodiment of the present invention.

FIG. 12 is an equivalent circuit diagram of a pixel of one pixel region according to an exemplary embodiment of the present invention. FIG. 13 is a cross-sectional view of one pixel according to an exemplary embodiment of the present invention. The display device according to an exemplary embodiment of the present invention illustrated in FIGS. 12 and 13 may be a liquid crystal display device; however, exemplary embodiments of the present invention are not limited thereto.

Referring to FIG. 12, substantially each pixel PX may include a TFT TR3, a storage capacitor Cst, and a liquid crystal capacitor Clc. The liquid crystal capacitor Clc may be a display element. The storage capacitor Cst may be parallel-connected to the liquid crystal capacitor Clc.

The TFT TR3 may be connected to a gate line GLi and a data line DLj. The TFT TR3 may output a data signal applied to the data line DLj in response to a gate signal applied to the gate line GLi. The liquid crystal capacitor Clc may be charged with a voltage corresponding to a data signal.

Referring to FIG. 13, the TFT TR3 may be substantially the same as the TFT TR as described with reference to FIGS. 1 to 7.

The liquid crystal capacitor Clc may include a liquid crystal layer LC disposed between the first electrode 410 and the second electrode 420. For example, the first electrode 410 of the liquid crystal capacitor Clc may be connected to the TFT TR3 via a hole passing through the planarization layer 109. The second electrode 420 may be disposed below an upper substrate 500; however, exemplary embodiments of the present invention are not limited thereto. The upper substrate 500 may include a color filter CF and a black matrix BM. According to an exemplary embodiment of the present invention, the first electrode 410 and the second electrode 420 may be disposed above the substrate 100.

In an exemplary embodiment of the present invention, the TFT substrate may include the case where a TFT or a TFT TR as illustrated in FIG. 1 has been formed above the substrate 100. The TFT substrate may include the case where the planarization layer 109 has been formed above a TFT TR2 and a TFT TR3 as illustrated in FIGS. 11 and 13. Furthermore, the TFT substrate may include where pixel electrodes 310 and 410 have been formed above a TFT TR2 and a TFT TR3.

While the present invention has been particularly shown and described in reference to exemplary embodiments thereof, it will be understood by those of ordinary skill in the art that various changes in form and details and equivalents thereof may be made therein without departing from the spirit and scope of the inventive concept as defined by the following claims.

What is claimed is:

1. A thin film transistor substrate, comprising:
   a substrate;
   a semiconductor layer disposed on the substrate, the semiconductor layer comprising a channel region, and a source region and a drain region respectively disposed at first and second sides of the channel region;
   a gate electrode disposed on the semiconductor layer, and comprising a lower surface and an upper surface, wherein a width of the gate electrode gradually increases from the lower surface to the upper surface;
   a gate insulating layer disposed between the gate electrode and the semiconductor layer;
   a first insulating layer disposed on the substrate and having a first hole in which the gate electrode is located, wherein a width of an upper part of the first hole is greater than that of a lower part of the first hole, and wherein the first insulating layer exposes the upper surface of the gate electrode and surrounds the gate electrode, wherein the first insulating layer has a first thickness, and the semiconductor layer, the gate insulating layer and the gate electrode have a combined thickness that is equal to the first thickness;
   a first electrode disposed on the substrate, and including a first electrode layer disposed on one of the source region and drain region, and a second electrode layer disposed on the first electrode layer;
   an auxiliary electrode disposed on the gate electrode; and
   a second insulating layer disposed on the first insulating layer, wherein the second electrode layer and the auxiliary electrode are in direct contact with an uppermost surface of the second insulating layer and penetrate the second insulating layer, wherein an upper surface of the second electrode layer and an upper surface of the auxiliary electrode are coplanar and are separated from each other while disposed above the uppermost surface of the second insulating layer,
   wherein a portion of the second electrode layer that is in direct contact with an uppermost surface of the first electrode layer on a same plane as an upper surface of the first insulating layer is integrally formed with a portion of the second electrode layer that is in direct contact with the uppermost surface of the second insulating layer,
   wherein a width of the uppermost surface of the first electrode layer is not greater than a width of a lowermost surface of the second electrode layer.

2. The thin film transistor substrate of claim 1, wherein the upper surface of the gate electrode and an upper surface of the first insulating layer meet at the same plane.

3. The thin film transistor substrate of claim 1, wherein a length of the semiconductor layer in a first direction is greater than a length of the gate insulating layer in the first direction.

4. The thin film transistor substrate of claim 1, wherein the first insulating layer includes a second thickness different from the first thickness.

5. The thin film transistor substrate of claim 1, further comprising a second electrode disposed on the substrate, and including a third electrode layer and a fourth electrode layer, wherein the first electrode layer is disposed on the source region, wherein the third electrode layer is disposed on the drain region, and wherein the fourth electrode layer is disposed on the third electrode layer and above the uppermost surface of the second insulating layer.

6. A display device, comprising:
   the thin film transistor substrate of claim 1; and
   a display element disposed on the thin film transistor substrate.

7. The display device of claim 6, wherein the display element comprises an organic light-emitting diode.

8. The thin film transistor substrate of claim 1, wherein the second insulating layer is disposed on the upper surface of the gate electrode and an upper surface of the first insulating layer.

9. The thin film transistor substrate of claim 8, wherein the auxiliary electrode contacts the gate electrode via a contact hole in the second insulating layer.

10. The thin film transistor substrate of claim 9, wherein the first electrode is electrically connected to the one of the source and drain regions.

11. The thin film transistor substrate of claim 10, wherein the first electrode layer directly contacts the one of the source and drain regions, and
    wherein the second electrode layer directly contacts the first electrode layer.

12. The thin film transistor substrate of claim 11, wherein the first electrode layer comprises a same material as the gate electrode.

13. The thin film transistor substrate of claim 11, further comprising:
    a second hole disposed in the first insulating layer and exposing the one of the source and drain regions, wherein the first electrode layer is disposed within the second hole.

14. The thin film transistor substrate of claim 11, wherein the first insulating layer surrounds the first electrode layer and exposes the uppermost surface of the first electrode layer.

15. The thin film transistor substrate of claim 11, wherein the second electrode layer contacts the first electrode layer via a hole in the second insulating layer.

16. A thin film transistor substrate, comprising:
    a substrate;
    a semiconductor layer disposed on the substrate, the semiconductor layer comprising a channel region, and a source region and a drain region respectively disposed at first and second sides of the channel region;

a gate electrode disposed on the semiconductor layer, and including a reversed tapered shape;

a gate insulating layer disposed between the gate electrode and the semiconductor layer;

a first insulating layer disposed on the substrate and having a first hole, wherein a width of an upper part of the first hole is greater than that of a lower part of the first hole, wherein the first insulating layer exposes an upper surface of the gate electrode and surrounds the gate electrode located in the first hole, wherein the first insulating layer has a first thickness, and the semiconductor layer, the gate insulating layer and the gate electrode have a combined thickness that is equal to the first thickness;

a first electrode disposed on the substrate, and including a first electrode layer disposed on the source region or the drain region, and a second electrode layer disposed on the first electrode layer;

an auxiliary electrode disposed on the gate electrode; and a second insulating layer disposed on the first insulating layer, wherein the second electrode layer and the auxiliary electrode are in direct contact with an uppermost surface of the second insulating layer and penetrate the second insulating layer, wherein an upper surface of the second electrode layer and an upper surface of the auxiliary electrode are coplanar and are separated from each other while disposed above the uppermost surface of the second insulating layer, wherein a portion of the second electrode layer that is in direct contact with an uppermost surface of the first electrode layer on a same plane as an upper surface of the first insulating layer is integrally formed with a portion of the second electrode layer that is in direct contact with the uppermost surface of the second insulating layer, wherein a width of the uppermost surface of the first electrode layer is not greater than a width of a lowermost surface of the second electrode layer.

17. A thin film transistor substrate, comprising:

a substrate;

a semiconductor layer disposed on the substrate, the semiconductor layer comprising a channel region, a source region and a drain region;

a gate insulating layer disposed on the semiconductor layer;

a gate electrode disposed on the gate insulating layer, a first electrode layer connected to one of the source and drain regions;

a second electrode layer disposed on the first electrode layer;

a first insulating layer disposed on the substrate and having a first hole in which the gate electrode is located and a second hole in which the first electrode layer is located, wherein a width of an upper part of the first hole is greater than that of a lower part of the first hole, and wherein the first insulating layer exposes an upper surface of the gate electrode and an uppermost surface of the first electrode layer, and surrounds the gate electrode and the first electrode layer;

a pixel electrode disposed on and electrically connected to the second electrode layer;

an auxiliary electrode disposed on the gate electrode; and a second insulating layer disposed between the first insulating layer and the pixel electrode and surrounding the second electrode layer and the auxiliary electrode, wherein the second electrode layer and the auxiliary electrode directly contact an uppermost surface of the second insulating layer, wherein an upper surface of the auxiliary electrode connected to the gate electrode and an upper surface of the second electrode layer connected to the first electrode layer are coplanar and separated from each other while disposed above the uppermost surface of the second insulating layer, wherein a portion of the second electrode layer that is in direct contact with an uppermost surface of the first electrode layer on a same plane as an upper surface of the first insulating layer is integrally formed with a portion of the second electrode layer that is in direct contact with the uppermost surface of the second insulating layer, wherein a width of the uppermost surface of the first electrode layer is not greater than a width of a lowermost surface of the second electrode layer.

18. The thin film transistor substrate of claim 17, wherein the auxiliary electrode is connected to the gate electrode via a contact hole of the second insulating layer.

19. The thin film transistor substrate of claim 17, wherein the upper surface of the gate electrode, the uppermost surface of the first electrode layer, and an upper surface of the first insulating layer are coplanar.

* * * * *